United States Patent [19]

Ozaki

[11] Patent Number: 5,568,564
[45] Date of Patent: Oct. 22, 1996

[54] IMAGE PROCESSING APPARATUS AND METHOD FOR INSPECTING DEFECTS OF ENCLOSURES OF SEMICONDUCTOR DEVICES

[75] Inventor: Takayuki Ozaki, Hyogo-ken, Japan

[73] Assignee: Kabushiki Kaisha Toshiba, Kawasaki, Japan

[21] Appl. No.: 931,517

[22] Filed: Aug. 21, 1992

Related U.S. Application Data

[63] Continuation of Ser. No. 841,209, Feb. 27, 1992, abandoned, which is a continuation of Ser. No. 613,457, Nov. 14, 1990, abandoned, which is a continuation of Ser. No. 346,664, May 3, 1989, abandoned.

[30] Foreign Application Priority Data

May 10, 1988 [JP] Japan .................................. 63-113355

[51] Int. Cl.⁶ .................................................. G06K 9/00
[52] U.S. Cl. ........................................ 382/149; 382/168
[58] Field of Search ................................ 382/8, 18, 33, 382/34, 51, 48, 149, 145, 168, 169, 170, 209, 216; 358/106; 348/125, 126, 129, 130

[56] References Cited

U.S. PATENT DOCUMENTS

| | | | |
|---|---|---|---|
| 4,472,736 | 9/1984 | Ushino et al. | 382/18 |
| 4,484,081 | 11/1984 | Cornyn, Jr. et al. | 358/106 |
| 4,543,659 | 9/1985 | Ozaki | 382/8 |
| 4,701,859 | 10/1987 | Matsuyama et al. | 382/34 |

FOREIGN PATENT DOCUMENTS

| | | |
|---|---|---|
| 142990 | 5/1985 | European Pat. Off. . |
| 255949 | 2/1988 | European Pat. Off. . |
| 263473 | 4/1988 | European Pat. Off. . |

OTHER PUBLICATIONS

European Search Report No. EP 89108384 dated Oct. 30, 1990.
Shima et al., "An Automatic Visual Inspection Method for a Plastic Surface Based on Image Partitioning and Gray–Level Histograms," Systems and Computers In Japan, vol. 17, No. 5, 1986.
Patent Abstracts of Japan, vol. 6, No. 241 (P–158) (1119), Nov. 30, 1982.

*Primary Examiner*—Yon J. Couso
*Attorney, Agent, or Firm*—Finnegan, Henderson, Farabow, Garrett & Dunner, L.L.P.

[57] ABSTRACT

The present invention provides an image processing apparatus for inspecting defects of enclosure of semiconductor devices, comprising first histogram memory means for storing a relative density degree of a first image signal or a reference signal, second histogram memory means for storing a relative density degree of a second image signal of an object to be inspected, third histogram memory means for storing an accumulated value of the relative degree supplied from the first histogram memory, fourth histogram memory means for storing an accumulated value of the relative degree supplied from the second histogram memory, and coincidence degree detection means for detecting the coincidence degree between data from the third histogram memory means and the fourth histogram memory means.

25 Claims, 8 Drawing Sheets

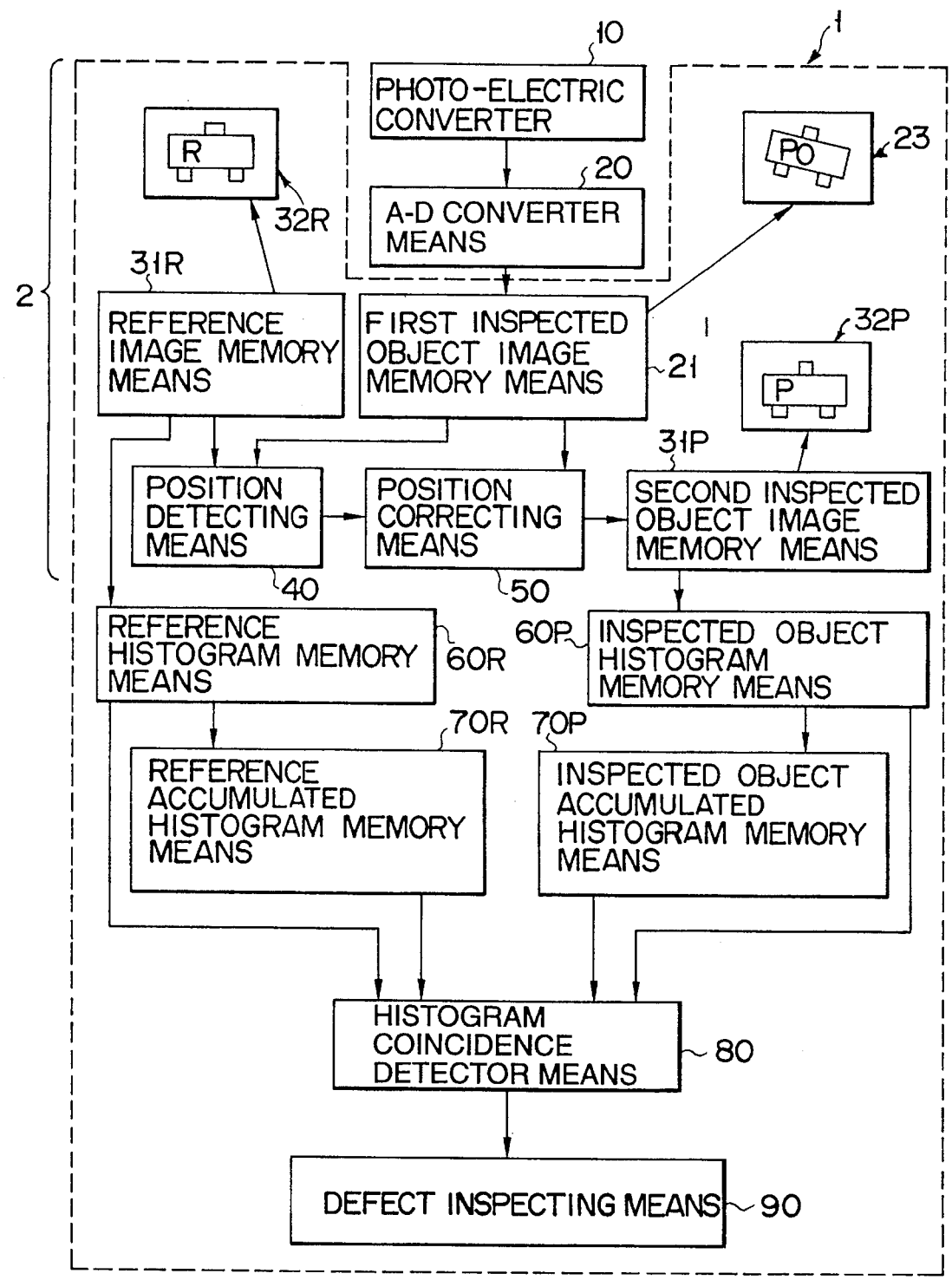
F I G. 1

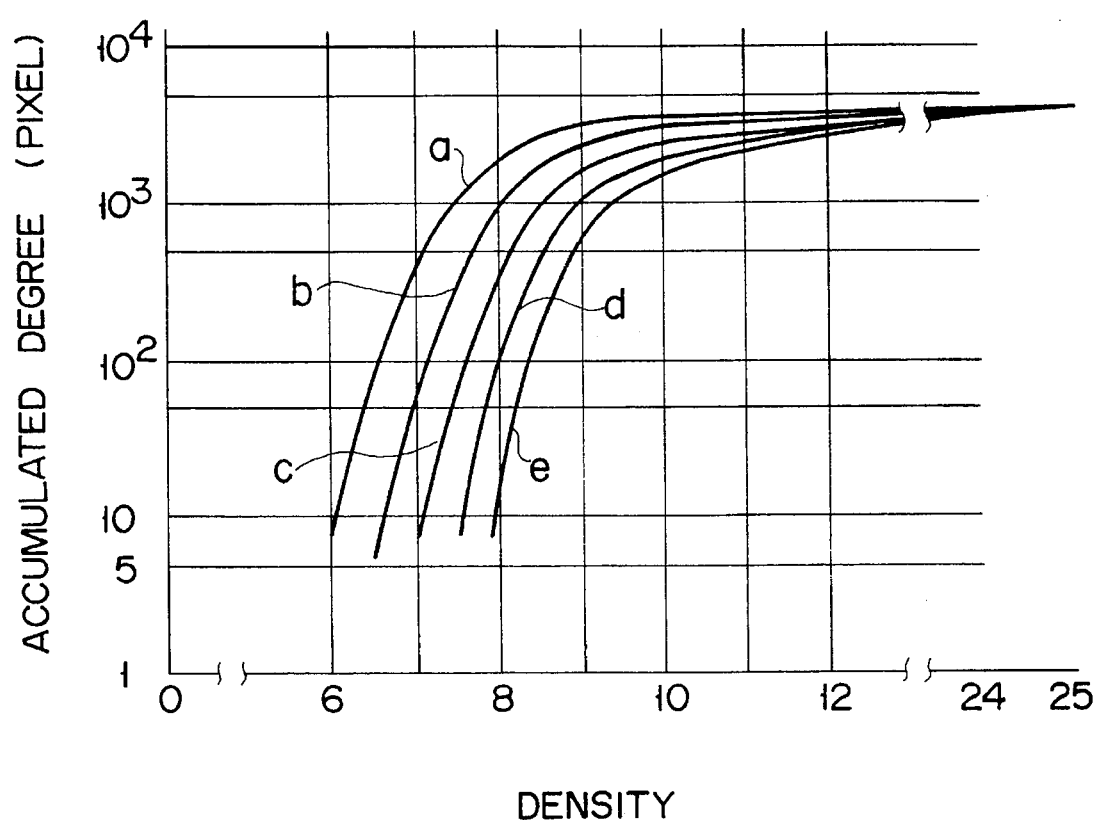
F I G. 6

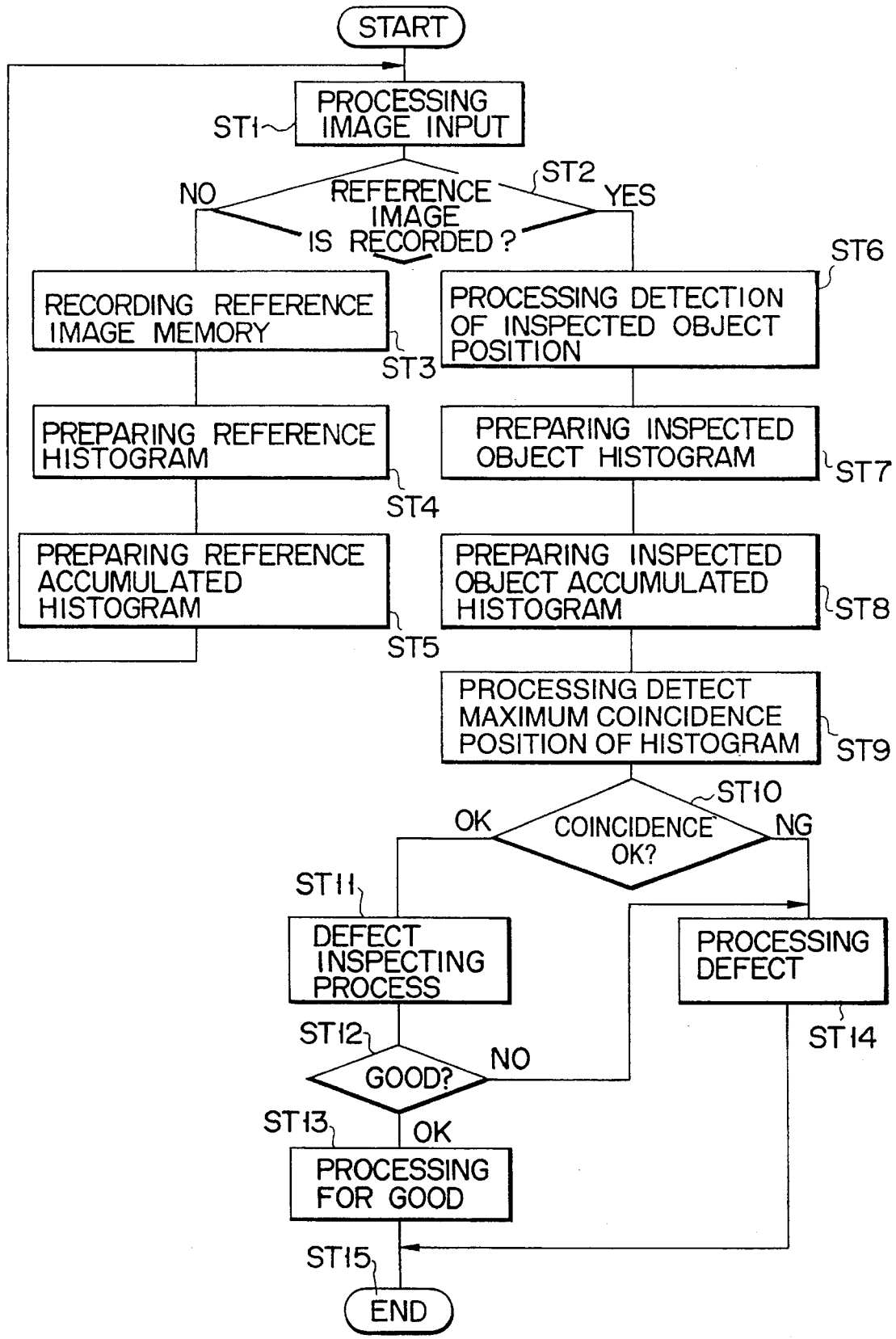
F I G. 10

IMAGE PROCESSING APPARATUS AND METHOD FOR INSPECTING DEFECTS OF ENCLOSURES OF SEMICONDUCTOR DEVICES

This application is a continuation of application Ser. No. 07/841,209, filed Feb. 27, 1992, now abandoned, which is a continuation application of Ser. No. 07/613,457, filed Nov. 14, 1990, now abandoned, which is a continuation of application Ser. No. 07/346,664, filed May 3, 1989, now abandoned.

BACKGROUND OF THE INVENTION

1. Field of the Invention

The present invention relates to an image processing apparatus and method, in particular, for inspecting defects such as pinholes or breakage in an enclosure of a semiconductor device, by using density images of the enclosure. The enclosure is, for example, resin mold.

2. Description of the Related Art

Conventionally, a defect inspection of resin mold products of semiconductor devices has been performed by the naked eye, with respect to all products or products selected at random. However, the precision of the inspection by the naked eye varies from person to person, and is not reliable. Further, the size of semiconductor devices has been decreased year by year, and the inspection has been conducted with use of a microscope, resulting in fatigue of the eye. Under these circumstances, the precision of the inspection by the eye is low.

On the other hand, in a well-known inspection method, image data of the surface of a resin mold is converted to an electric signal through a photoelectric converter, and two-value image data items are produced by providing a given threshold value. However, in the two-value processing, the amount of obtained image data is small and the determination of the threshold value is very difficult.

A method of an inspection using density images of an object is disclosed in "HITACHI Hyoron, vol. 67, No. 9, 1985, Small-Sized Image Processing Apparatus for Electronic Part Inspection, SBIP (pp. 71–74)". This document teaches a technique of inspection using light-emission patterns of light-emitting diodes. In this technique, a light emission pattern of a light-emitting diode, consisting of a light-emission area 101 and a background area 102, is obtained by a TV camera (see FIG. 9A). From this light emission pattern, a graph showing a distribution of degrees of density as shown in FIG. 9B is prepared. If the brightness (or density) of light emission pattern is higher or lower than a reference value, a difference R between the density of the light emission area 103 and the background area 104 varies. Namely, the brightness can be detected by checking whether or not the difference R falls within the scope of the reference value. A divergent value of an emission light pattern density distribution is obtained, as shown in FIG. 9C, and compared with a reference divergent value, thus detecting light emission blurring.

As stated above, various drawbacks reside in the method of inspecting defects in the resin mold of a resin-sealed type semiconductor apparatus, which is performed by the eye. Under the circumstance, it is desired to develop a system for automating the process of the inspection thereby to manufacture reliable semiconductor devices at a high productivity. In this system, when a malfunction occurs in a step of the process, the process routine is immediately returned to the previous step.

In most of currently developed automated image processing systems for defect inspection using two-value data, it is very difficult to determine the threshold value when a contrast between a defect and the background is small, as in the case of a resin mold. Thus, suitable two-value data images cannot be obtained.

Even with the aforementioned density image processing system, correct detection of defects on a resin surface is difficult, since a drift is caused in the density due to a temperature rise in an ITV camera, a trademark or the like is printed on the surface of an object or a resin mold. Further, for automation of defect inspection, a pre-process of detecting the position of the object is necessary. However, a contrast between the resin mold and the background is low, and the distinction therebetween is difficult. Thus, it is difficult to precisely detect the position of the resin mold.

SUMMARY OF THE INVENTION

The object of the present invention is to provide an image processing apparatus and method, in particular, for inspecting defects such as pinholes or breakage in an enclosure of a semiconductor device. This invention can eliminate drawbacks residing in the conventional defect inspection process by the eye and the image processing process using two-value data. Also, the apparatus and method of the present invention can correctly detect the position 1 of the enclosure semiconductor device. Furthermore, the apparatus and method of the invention are free from the temperature drift due to the ITV camera, and are suitable for automated processing.

An image processing apparatus of the present invention for inspecting defects of resin molds of semiconductor devices comprises first histogram memory means (60R) for storing a relative density degree of a first image signal as reference signal, second histogram memory means (60P) for storing a relative density degree of a second image signal of an object to be inspected, third histogram memory means (70R) for storing an accumulated value of the relative degree supplied from the first histogram memory (60R), fourth histogram memory means (70P) for storing an accumulated value of the relative degree supplied from the second histogram memory (60P), and coincidence degree detection means (80P) for detecting the coincidence degree between data from the third histogram memory means (70R) and the fourth histogram memory means (70P).

In the apparatus with the above structure, the reference image density accumulated histogram is compared with the object image density accumulated histogram. This apparatus can overcome conventional drawbacks such as judgment error in visual inspection or low reliability of inspection in small-sized products. Also, the problems due to insufficient data items and difficulty in deciding threshold values in the two-value processing can be solved.

On the other hand, an image processing method of the present invention for inspecting defects of enclosures of semiconductor devices comprises: an input processing first step (ST1) for processing an image of an object to be inspected, a second step (ST2) for judging whether or not a reference image has been recorded, a third step (ST3) for recording an image signal of the reference image in a memory, when the result in the second step (ST2) is NO, a fourth step (ST4) for forming a reference image density histogram, a 5th step (ST5) for forming a reference image density accumulated histogram from said reference image density histogram, a routine of control being returned to the input processing first step (ST1) after the 5th step (ST5), a 6th step (ST6) for detecting the position of the object, the 6th step (ST6) being performed when the result in the second step (ST2) is YES, a 7th step (ST7) for forming an object image density relative histogram from a result of detecting of the 6th step, an 8th step (ST8) for forming an object image density accumulated relative histogram of said object image density relative histogram, a 9th step (ST9) for detecting a maximum coincidence position between said reference image density accumulated histogram and said object image density accumulated relative histogram, a 10th step (ST10) for judging a coincidence degree at the maximum coincidence position in said histograms, a defect inspecting 11th step (ST11) for inspecting defects in the object, based on the accumulated histograms, the 11th step (ST11) being performed when the result in the 10th step (ST10) is OK, a 12th step (ST12) for judging whether or not the object is good, based on the result in the defect inspecting 11th step (ST11), a 13th step (ST13) for subjecting a good object to a predetermined processing, when the result in the 12th step (ST12) is OK, and a 14th step (ST14) for subjecting a bad object to a predetermined processing, when the result in the 10th step (ST10) is NG, or when the result in the 12th step (ST12) is NO.

With the above method, the inspection of defects of enclosures of semiconductor devices, which is free from problems of visual inspection and two-value processing, can be realized, as in the case of the image processing apparatus of the present invention for inspecting defects of enclosures of semiconductor devices.

BRIEF DESCRIPTION OF THE DRAWINGS

FIG. 1 is a block diagram showing an example of a structure of an image processing apparatus for inspecting defects in resin molds, according to the present invention;

FIG. 6 shows a drift characteristic of image density;

FIG. 10 is a software flowchart in the case where the present invention is worked with use of a microcomputer.

DETAILED DESCRIPTION OF THE PREFERRED EMBODIMENT

An embodiment of the image processing apparatus and method for inspecting defects in enclosure of semiconductor devices, according to the present invention, will now be described with reference to the accompanying drawings.

Figure 2:
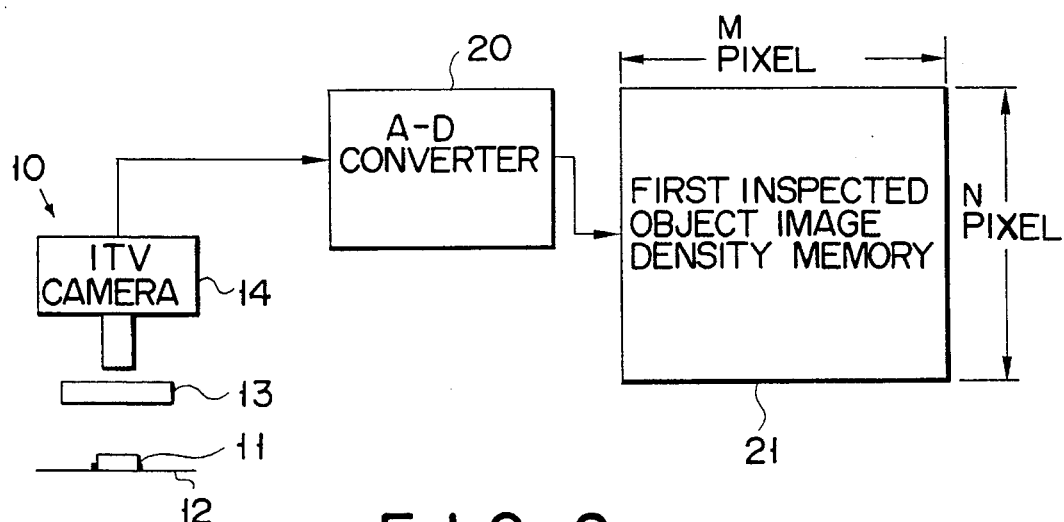
FIG. 2 shows an example of a structure of photoelectric conversion means.
Figure 3:
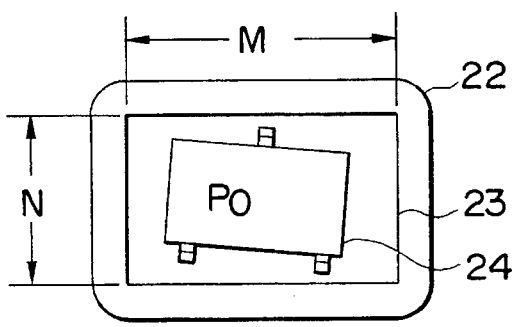
FIG. 3 shows a relationship between a monitor screen and a memory image Po.

FIG. 2 schematically shows conversion means 10 for converting an image of object 11 to an analog electric signal, A/D converter 20, and first inspected object image memory 21. The object or resin-sealed semiconductor device 11 is amounted on table 12. Ring-shaped illumination device 13 (e.g., MORITEX MHF-50L) uniformly illuminates the resin face of object 11. An upper face image of object 11 is picked up by ITV camera 14 (CS3310(TELi)), and is converted to an analog image electric signal. The electric signal is converted to a digital image signal by A/D converter 20 and is stored in image density memory 21. FIG. 3 shows the relationship between a screen of a monitor (not shown in FIG. 2) attached to ITV camera 14 and the image stored in memory 21. The outline of the screen of the monitor is defined by solid line 22, and the outline of the image stored in memory 21 is defined by solid line 23. In FIG. 3, symbols M and N represent the number of horizontal pixels and vertical pixels, respectively, which are variably set by the sampling frequency of A/D converter 20. In this embodiment, M=256, and N=240. Numeral 24 indicates the density image Po of object 11. Memory 21 has 8 bits for each pixel, and can represent the density of image Po in 256 levels at maximum. In this embodiment, the ranges of <0 (black) to 255 (white)> to <0 (black) to 64 (white)> are used. Also, in this embodiment, the pixel arrangement of each of reference image density memory 31R and second inspected object image density memory 31P (see FIG. 1) is identical to that of first inspected object image density memory 21.

Object 11 is mounted on a predetermined location of table 12 for the image pick-up operation. Since the inspection of the object is performed in real time, fine positioning is not carried out. Thus, it is necessary to adjust the position of image Po based on reference image R.

For this purpose, as shown in FIG. 1, reference image memory 31R for storing the reference density of image R of the resin mold and second inspected object image density memory 31P for storing position-inverted image density P are provided. In FIG. 1, reference numeral 32R indicates the position of reference image R stored in memory 31R, numeral 23 indicates the position of source object image Po stored in first inspected object image memory means 21, and numeral 32P denotes the position of position-converted object image P stored in memory 31P.

Figure 4A:
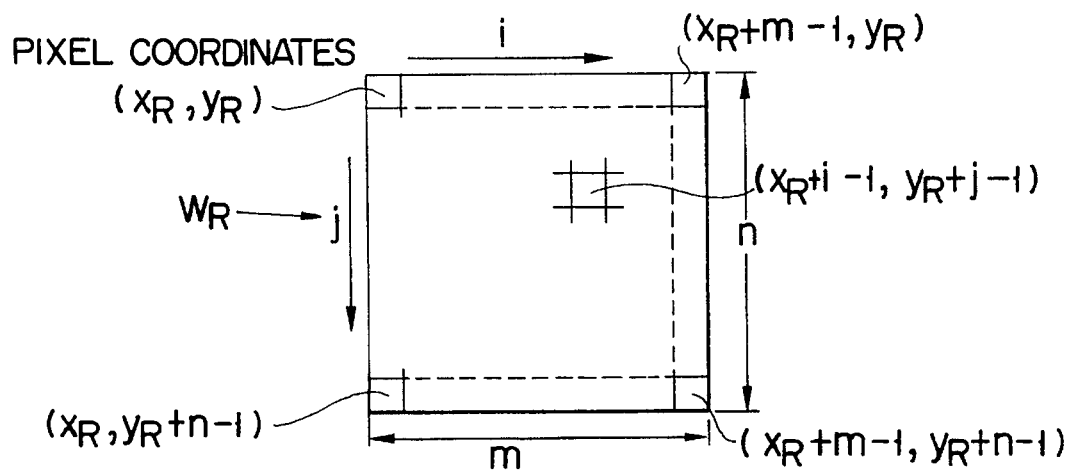
FIG. 4A shows a structure of a window.

Position detecting means for judging the pixel position of image Po stored in memory 21, which corresponds to the pixel position of image R stored in memory 31R, is constituted by using a pattern detecting device disclosed in Japanese Patent Disclosure (Kokai) No. 57-137978. FIG. 4(a) shows a structure of a window, with which a process of cutting out pixels of an image memory can be performed. Window $W_R$ indicates a predetermined rectangular region in the image memory. For convenience's sake, the pixel position $(x_R, y_R)$ of the upper left corner of the rectangular image determines the position of the window. The size of the window is determined by the number m of horizontal pixels and the number n of vertical pixels. Eight bits are assigned to one pixel. Characters R and P accompanied with characters x, y and w indicate the pixel coordinates of the reference image memory or the first object image memory, or the used window. The expression "R $(x_R, y_R)$" or "P $(x_p, y_p)$" indicates the pixel density data at the coordinate $(x_R, y_R)$ or $(x_p, y_p)$.

Figure 4B:
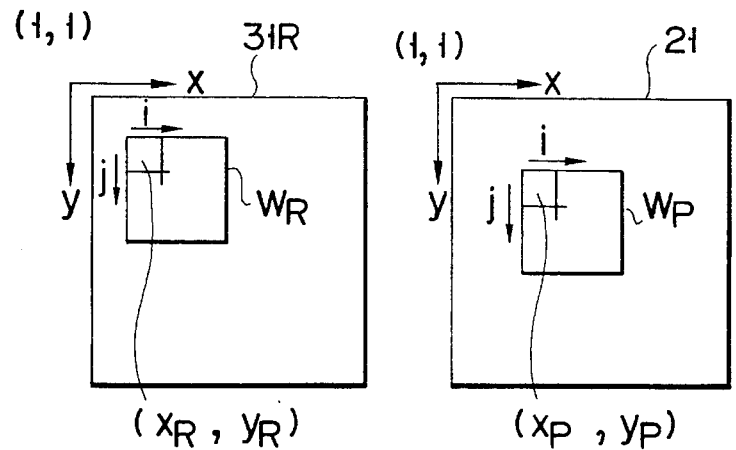
FIG. 4B illustrates a method of calculating a correlation coefficient, using window processing.

As shown in FIG. 4(B), a window $W_R$ is placed on the pixel at the coordinate $(x_R, y_R)$ of reference image memory 31R. A window $W_P$ is placed on the pixel at the coordinate $(x_p, y_p)$ of first inspected object image memory 21. The structure of each of windows $W_R$ and $W_P$ is identical to that shown in FIG. 4A. The correlation coefficient H between the group of m×n pixels cut out by windows $W_R$ and $W_P$ is given by the following formula:

$$H = \frac{A - \frac{1}{m \times n} B \cdot C}{\sqrt{D - \frac{1}{m \times n} B^2} \cdot \sqrt{E - \frac{1}{m \times n} C^2}} \quad (1)$$

$$A = \sum_{i=1}^{m} \sum_{j=1}^{n} \{P(x_p + i - 1, y_p + j - 1) \cdot R(x_R + i - 1, y_R + j - 1)\}$$

$$B = \sum_{i=1}^{m} \sum_{j=1}^{n} \{P(x_p + i - 1, y_p + j - 1)\}$$

$$C = \sum_{i=1}^{m} \sum_{j=1}^{n} \{R(x_R + i - 1, y_R + j - 1)\}$$

$$D = \sum_{i=1}^{m} \sum_{j=1}^{n} \{P(x_p + i - 1, y_p + j - 1)\}^2$$

$$E = \sum_{i=1}^{m} \sum_{j=1}^{n} \{R(x_R + i - 1, y_R + j - 1)\}^2$$

In formula (1), the value A is obtained from a summing circuit for summing the reference pixels and corresponding object pixels cut out by windows $W_R$ and $W_P$. The values B and C are obtained by a summing circuit for summing pixel data items in windows $W_r$ and $W_P$. The values D and E are obtained by a square adding circuit for pixel data items in windows $W_R$ and $W_P$. The value (m×n) represents the total number of pixels in the windows. These circuit elements constitute a two-dimensional data correlation coefficient calculation circuit. This circuit is described in detail in Japanese Patent Disclosure (Kokai) No. 57-137978.

Figure 4C:
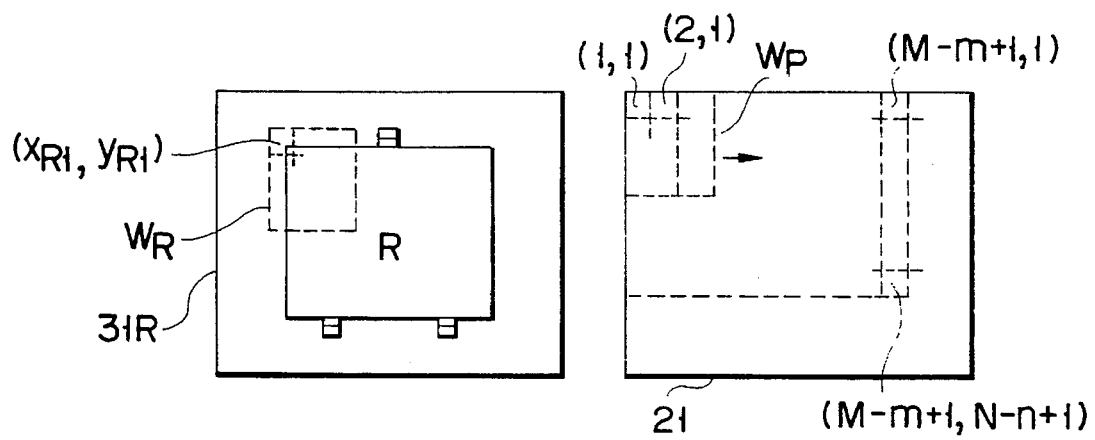
FIG. 4C illustrates a method of detecting a position, using window processing.

With reference to FIG. 4(C), a description is given of the case where the pixel position of source image Po in first object image memory 21 is determined in relation to the corresponding pixel position of reference image R in reference image memory 31R.

Window $W_R$ is arranged at the pixel position $(x_{R1}, y_{R1})$ including an upper left area of reference image R, and window $W_P$ is arranged at the pixel position (1, 1) in an upper left area of first object image memory 21. The correlation coefficient H (1, 1) between pixel groups cut out by windows $W_R$ and $W_P$ is obtained by formula (1), that is, the two-dimensional data correlation coefficient calculating circuit. Then, the position of window $W_R$ is fixed, and the position of window $W_P$ is shifted to the pixel position (2, 1). Thus, the correlation coefficient H (2, 1) is obtained, in like manner described above. Further, while the position of window $W_{R2}$ is fixed, data items of correlation coefficients H $(x_p, y_p)$, the number of which corresponds to (M−m+1)× (N−n+1), are similarly obtained with respect to pixels in a matrix defined by the horizontal position (M−m+1) and the vertical position (N−1+1) in first object image memory 21. These data items are fed to a position judging circuit, and a correlation coefficient H max (Xp1, yp1) indicative of a maximum value is selected. The pixel position of first object image memory 21, which corresponds to the pixel position $(x_{R1}, y_{R1})$ of reference image memory 31R, is (Xp1, Yp1). The position of window $W_R$ of the reference image memory is sequentially shifted to all pixels in a region including reference image R, and the pixel position (Xp, Yp) of the first object image memory corresponding to each pixel is repeatedly obtained by the above method.

Position correcting means 50 for transferring image data of image Po to second object image memory 31P comprises, for example, a memory address controller (MAC). When pixel addresses $(x_R, y_R)$ and (Xp, Yp) corresponding to the MAC are input, the contents Po (Xp, Yp) of the pixel (Xp, Yp) of first object image memory 21 are fed through a data bus to the pixel position (xp, yp) of second object image memory corresponding to the pixel $(x_R, y_R)$.

In the embodiment of position detection means 40, window $W_R$ was fixed at the pixel position $(x_R, y_R)$ of reference image R, window $W_P$ was shifted to all areas of first object image memory 21, and the correlation coefficients were repeatedly obtained to find the corresponding pixel position $(X_P, Y_P)$. However, the number of calculating operations can be reduced if a plurality of adjacent pixels are gathered as one pixel having an average image density, and the correlation coefficient calculation start position is obtained from a resultant reduced image, as disclosed in Japanese Patent Disclosure (Kokai) No. 57-137978.

Figure 4D:
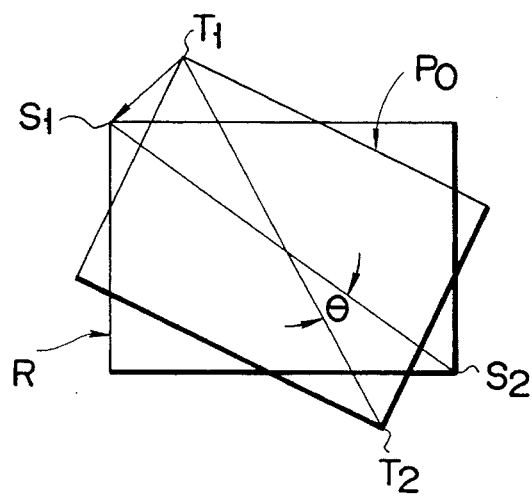
FIG. 4D illustrates a process of producing an image, using affine transformation.

In other embodiments of position detecting means 40 and position correcting means 50, affine transformation can be utilized. In FIG. 4D, the pixel matrix of reference image memory 31R is overlapped with the pixel matrix of first object image memory 21. In this figure, points T1 $(x_{PT1}, y_{PT1})$ and T2 $(x_{PT2}, y_{PT2})$ of image Po in first object image memory 21, which correspond to the upper left corner point S1 $(x_{RS1}, y_{RS1})$ and the lower right corner point S2 $(x_{RS2}, y_{RS2})$ of reference image R, are obtained by the position detecting means. Then, image Po is moved in parallel so that point T1 coincides with point S1, and the pixel matrix of image R is superposed on the pixel matrix of image Po by rotation over an angle about point S1. A pixel coordinate conversion formula for this technique is obtained (see "Electronics Parts Technical Report—27, 1984, pp. 10–11). If this coordinate conversion formula is applied to an IRS (image resampling sequencer, *Nikkei Electronics*, 1987, 9/7, (No. 429), pp. 75–76), the pixel data of the position of image Po in first object image memory 21, which was converted according to the conversion formula is output to the data bus and supplied to the pixel position of second object image memory 31P which is equivalent to reference image memory 31R. Thus, an image P of a pattern position equivalent to that of reference image R can be obtained.

Figure 5A:
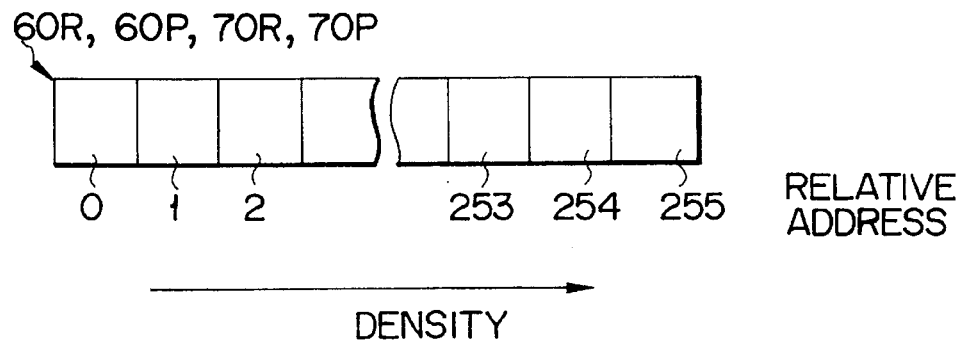
FIGS. 5A, 5B, 5C and 5D include views showing a one-dimensional histogram memory, a stored relative degree, and an accumulated relative degree.
Figure 5B:
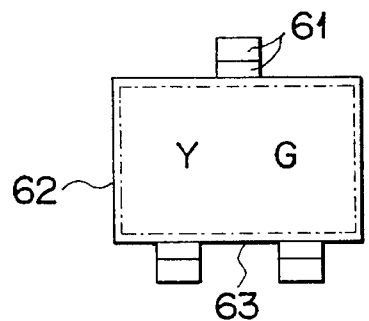
Figure 5C:
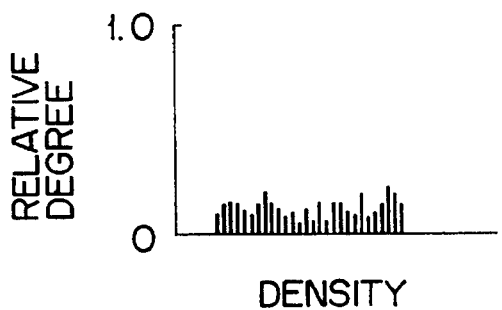
Figure 5D:
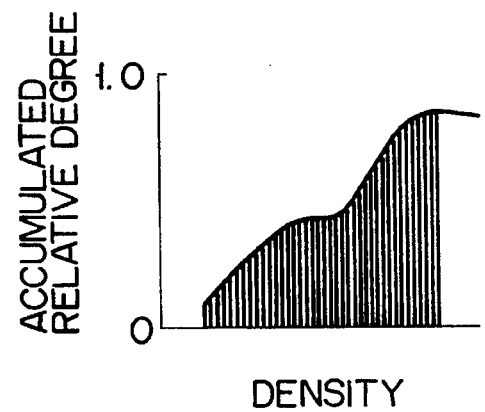

FIG. 5A shows a one-dimensional reference relative degree histogram memory and an accumulated relative degree histogram, and a one-dimensional object relative degree histogram memory and an accumulated relative degree histogram memory. Each memory has addresses corresponding to the image density levels. In this embodiment, the memory has a one-dimensionally arranged relative addresses 0 (black) to 255 (white), and each address comprises 16 bits. FIG. 5B shows a reference upper face image of an object or a semiconductor device. This image includes background image 61, resin mold image 62, and a mark image. The density of image pixels in a region 63 defined by a dot-and-dash line is inspected. A relative degree obtained by dividing all pixels of region 63 by pixels having the density level is stored in addresses of reference relative degree histogram memory 60R and object relative degree histogram memory 60P. Then, the values of relative degrees stored in address 0 to address 255 are sequentially added, and accumulated relative degrees corresponding to the addresses of reference histogram memory 70R and object histogram memory 70P. As a result, an equivalent relative degree histogram and an accumulated relative degree histogram are prepared, as shown in FIGS. 5C and 5D.

In general, a density histogram drifts with the lapse of time. FIG. 6 shows drift characteristics of the accumulated degree histogram in the system including the ITV camera, illumination device and image processing means. The abscissa indicates the image density of the resin mold surface in 6-bit or 64 levels (0 (black) to 63 (white)), and the ordinate denotes the accumulated degree. The number of pixels in the density inspection region on the resin surface is 64×64=4096. FIG. 6 shows the case where a super-mini transistor (container TO-236) having a resin mold upper face size of (2.9 mm×1.5 mm) is used as an object. In the figure, curve a indicates an accumulated degree histogram just after the turning-on, curve b indicates the histogram after 5 minutes, curve c indicates the histogram after 10 minutes, curve d indicates the histogram after 20 minutes, and curve e indicates the histogram after one hour. When 256 density levels are provided, a drift of about density level 10 is observed. Thus, in inspecting defects, the drift characteristics cannot be ignored.

Figure 7A:
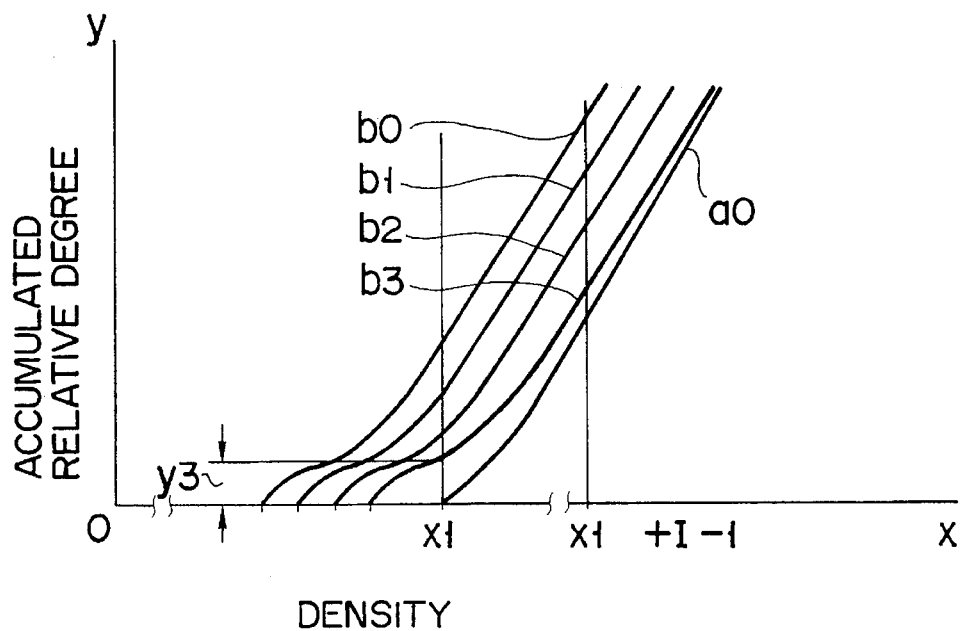
FIGS. 7A, 7B and 7C include views showing an embodiment of histogram coincidence degree detection means according to the present invention.
Figure 7B:
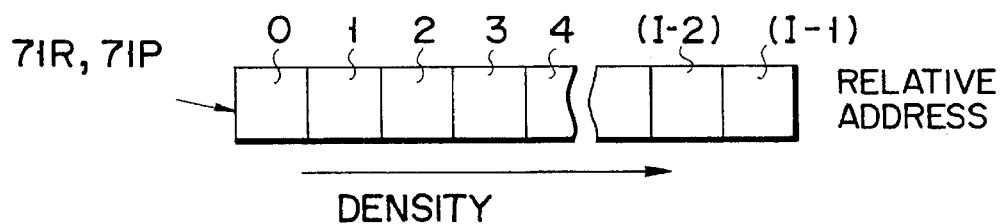

FIG. 7A is illustrative of a case where a coincident portion between the reference accumulated relative degree histogram and the object accumulated relative degree histogram is detected by using a correlation coefficient, whereby defects in the resin mold can be inspected. The abscissa of FIG. 7A indicates the density levels of addresses (0 (black) to 255 (white)) of the reference one-dimensional accumulated relative degree histogram and the object one-dimensional accumulated relative degree histogram. The ordinate of FIG. 7A shows the accumulated relative degree (maximum value: 1). Curves a0 and b0 indicate reference and object accumulated relative degree histograms y=F(x) and y=E(x), respectively. Histograms are actually expressed by bent lines. In FIG. 7A, x and y have discrete values which are approximately expressed by curves. For example, the accumulated relative degree stored at density address x of the reference accumulated relative degree histogram is represented by F(x) or y. FIG. 7B shows a structure of reference/object one-dimensional component accumulated relative degree memories 71R and 71P. The memories 71R and 71P have functions similar to the function of the window used for two-dimensional image processing. Each memory has continuous relative addresses 0 to (I−1), and one address consists of 16 bits. The value I is in the range of $1 \leq I \leq 256$. Thus, a desired portion of the one-dimensional histogram can be cut out by the memory 71R or 71P.

In FIG. 7A, data items in the density range of x1 to x1+I−1 are cut out by two memories 71R and 71P. The correlation coefficient G1(0) between cut-out curve portions of the reference histogram a0 and object histogram b0 is obtained by the following formula:

$$G_1(0) = \left\{ \sum_{i=0}^{I-1} F(x_1+i) \cdot E(x_1+i) - \frac{1}{I^2} \sum_{i=0}^{I-1} F(x_1+i) \cdot \sum_{i=0}^{I-1} E(x_1+i) \right\} \div \left\{ \sqrt{\sum_{i=0}^{I-1} F(x_1+i)^2 - \frac{1}{I^2} \left( \sum_{i=0}^{I-1} F(x_1+i)^2 \right)} \times \sqrt{\sum_{i=0}^{I-1} E(x_1+i)^2 - \frac{1}{I^2} \left( \sum_{i=0}^{I-1} E(x_1+i)^2 \right)} \right\} \quad (2)$$

Then, the correlation coefficient between the cut-out portion of the curve a0 and a portion cut out in a range of x1 to x1+I−1 of the curve b1 or y=E(x−1) which is obtained by shifting the curve b0 to the right by one degree is obtained by formula (2), and the obtained correlation coefficient is supposed to be G1 (−1). When the value G1 (−1) is obtained, only E(x1+i) is changed to E(x1−1+i) in formula (2). The same arithmetic operation is repeated with respect to the curve b2 which is obtained by shifting the curve b1 to the right by one degree, thereby to obtain the value G1 (−2). Similarly, values G1 (−3), G1 (−4) . . . G1 (−n) are obtained. A maximum value among G1 (0) to G1 (−n) is obtained. In the present embodiment, it is supposed that the maximum value G1 (−3) is obtained by setting I=24 and n=10. That is, a curve obtained by correcting the drift in the object histogram b0 is b3 or y=E(x−3). When the density level of the reference curve a0 is lower than the lower limit value z1, the accumulated relative degree is y=E (x1−3), and the pixel area in this case is obtained by the formula, E (x1−3)×(all area of object inspection).

Figure 7C:
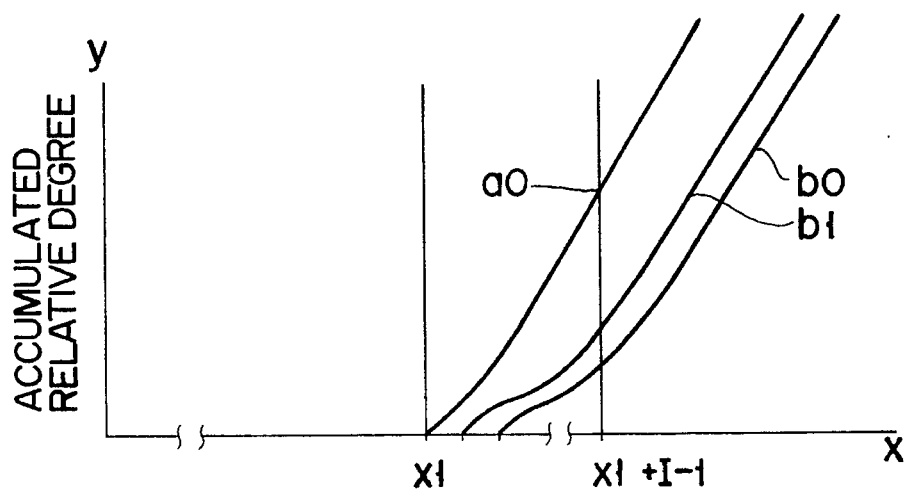

As shown in FIG. 7(C), when the object accumulated relative degree histogram b0 is located on the right side of the reference accumulated relative degree histogram a0, the curve b1 located on the right side of histogram a0 by one degree is expressed by y=E (x+1). By changing E (x1+i) to E (x1+1+i) in formula (2), the correlation coefficient G1 (1) is calculated. Similarly, the values G1 (2), G1 (3) . . . G1 (n) are obtained, and a maximum value among them is obtained. If it is not detected in advance whether the curve b0 is located on the left side or right side of the curve a0, the values G1 (−n) . . . G1 (−2), G1 (−1), G1 (0), G1 (1), G1 (2) . . . G1 (n) are calculated, and a maximum value among them is obtained.

In order to obtain more exact partial coincidence degree between the reference accumulated histogram and the object accumulated histogram, the position of the accumulated relative degree memories 71R and 71P is shifted to the right by one degree, and the values of G2 (0), G2 (−1), G2 (−2) . . . G2 (−n) are obtained in like manner described above. This operation is repeated until the contrast range of the histogram curve a0 (the range between the lower limit density x1 at which the accumulated relative degree is 0 and the upper limit density at which the accumulated relative degree is 1) is covered. A maximum value among G1, G2 . . . Gk is obtained, and the histograms are overlapped at the maximum value. Thus, the pixel area which does not fall within the reference image contrast range between the upper and lower limits.

Figure 8:
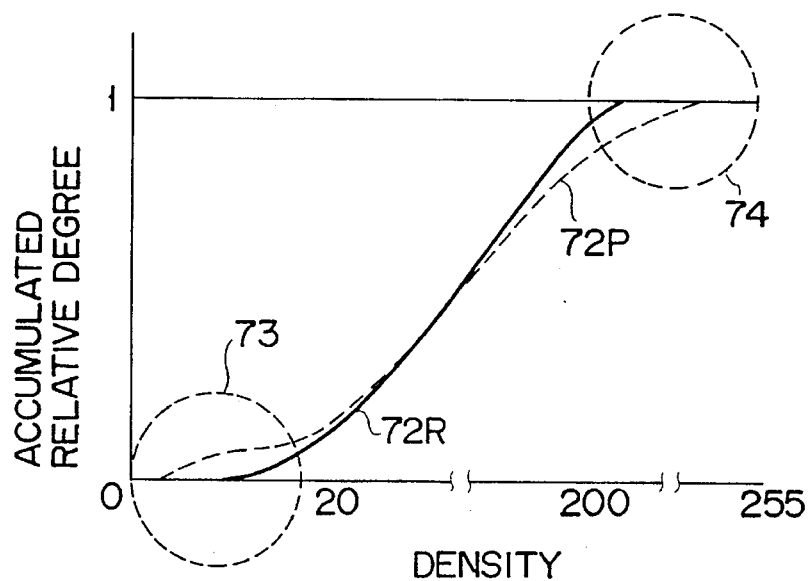
FIG. 8 shows an embodiment of enclosure defect inspecting means according to the present invention.
Figure 9A:
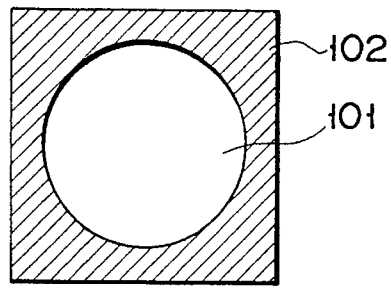
FIGS. 9A, 9B and 9C include views showing prior art.
Figure 9B:
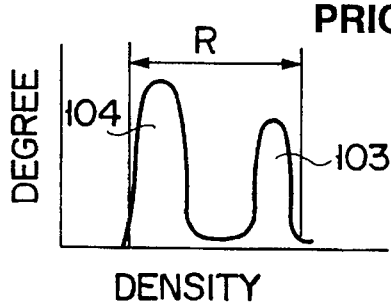
Figure 9C:
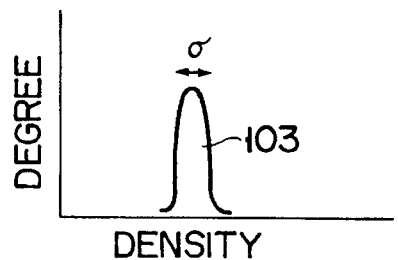

In general, in the object accumulated relative degree histogram or object relative degree histogram, defects such as pinholes on the resin surface exist in a low density (dark) portion, and breakages in the resin mold exist in a high density (light) portion. In FIG. 8, a curve 72R (solid line) and a curve 72P (broken line) indicates a reference accumulated relative degree histogram and an object accumulated relative degree histogram. The histogram 72P shows the case where the resin mold surface of the object has pinholes and breakages. It is possible to compare the dark portion 73 (e.g., density levels of 0 to 20) and the light portion 74 (e.g., density levels of 200 to 255) with the reference histogram pattern, thus detecting defects in the resin surface.

In order to eliminate the influence due to a drift by which the histograms may be displaced to the right or left, it is possible to perform total positioning of the histograms by pattern matching. When the maximum value of the correlation coefficient obtained in this case is 0.7 or less, it is judged that the histogram is largely displaced. When the value of the correlation coefficient is higher than 0.7, the partial coincidence degree of the histograms is obtained by the above manner, and the correlation coefficient is compared to the reference value which was obtained in advance. Thus, the quality of the mold can be judged.

When a contrast level between the resin mold and the background is high, the distinction therebetween is easy. For example, the upper and lower limit values of the accumulated relative degrees are set to constants, and the quality of the mold can be judged based on the pixel area which is out of the range between the upper and lower limits.

Furthermore, the present invention can be worked by using software loaded in a microcomputer. FIG. 10 shows a flowchart of the software. In the flowchart, steps ST2 to ST5 relate to the reference image, steps ST6 to ST9 relate to the processing of image data of an inspected object, and steps ST10 to ST14 relate to the processing of comparison results.

In ST1, an image of an object is stored in a memory. In ST2, it is detected whether or not a reference image is recorded. In ST3, an image signal of the reference image is recorded in the memory. The routine goes to ST3 when the result in ST2 is NO. In ST4, a reference image density histogram is prepared. In ST5, a reference image density accumulated histogram is prepared. After ST5, the routine returns to ST1.

On the other hand, the routine goes to ST6 when the result in ST2 is YES. In ST6, the position of the inspected object is detected. In ST7, an object image relative density histogram is prepared in comparison with the reference image density. In ST8, an object image density accumulated histogram is prepared. In ST9, a maximum coincidence value is formed between the reference accumulated histogram prepared in ST5 and the object accumulated histogram prepared in ST8. In ST10, the degree of coincidence is judged based on the result of ST9. The routine goes to ST11, when the result in ST10 is OK. In ST11, defects of the object are inspected based on the accumulated histograms. In ST12, it is judged whether the quality of the object is good or bad, based on the result in ST11. When the result in ST12 is OK, the processing for a good object is performed in ST13. For example, a signal indicating that the object is good is output from the device.

On the other hand, when the result in ST10 is NG (no good) or the result in ST12 is NO, the routine goes to ST14 in which the processing for a defective object is performed. For example, a signal indicating that the object is bad is output from the device.

According to the image processing apparatus and method of the present invention for inspecting defects of enclosure of semiconductor devices, an object density image relative degree histogram pattern and an object density image accumulated relative degree histogram pattern are compared with a reference pattern, thereby to inspect defects in resin molds. This invention can overcome drawbacks in a conventional visual inspection method or in a two-value image processing method. The influence due to a density drift in an ITV camera or the like can be eliminated. In addition, in the present invention, the detection of the position of the object and the coordinate conversion of the image can be performed by a computer in a pre-processing step. Thus, the real-time inspection of defects in the resin mold can be realized. Also, the method and apparatus of the invention is suitable for automated inspection.

What is claimed is:

1. An image processing apparatus for inspecting enclosures of semiconductor devices for defects, comprising:

first means for storing electric signals each representative of a relative density degree of a first image signal as a reference signal;

second means for storing electric signals each representative of a relative density degree of a second image signal of one of said enclosures to be inspected;

third means for storing an electric signal representative of an accumulated value of the relative degree supplied from said first storing means as a first histogram R;

fourth means for storing an electric signal representative of an accumulated value of the relative degree supplied from said second storing means as a second histogram P;

means for detecting the coincidence degree H between the first histogram R and the second histogram P by electronically performing calculation based on the following formulas:

$$H = \frac{A - \frac{1}{m \times n} B \cdot C}{\sqrt{D - \frac{1}{m \times n} B^2} \cdot \sqrt{E - \frac{1}{m \times n} C^2}}$$

$$A = \sum_{i=1}^{m} \sum_{j=1}^{n} \{P(X_p + i - 1 - 1, Y_p + j - 1) \cdot R(X_r + i - 1, Y_r + j - 1)\}$$

$$B = \sum_{i=1}^{m} \sum_{j=1}^{n} \{P(X_p + i - 1, Y_p + j - 1)\}$$

$$C = \sum_{i=1}^{m} \sum_{j=1}^{n} \{R(X_r + i - 1, Y_r + j - 1)\}$$

$$D = \sum_{i=1}^{m} \sum_{j=1}^{n} \{P(X_p + i - 1, Y_p + j - 1)\}^2$$

$$E = \sum_{i=1}^{m} \sum_{j=1}^{n} \{R(X_r + i - 1, Y_r + j - 1)\}^2$$

where $P(X_p, Y_p)$ and $R(X_r, Y_r)$ indicate pixel density data at coordinates $(X_p, Y_p)$ and $(X_r, Y_r)$, respectively, m is the number of pixels included in one horizontal pixel array of a window, and n is the number of pixels included in one vertical pixel array of the window, the window defining a range of the first and second histograms R and P at the time of calculation; and means for judging whether or not the inspected enclosure has defects by electronically comparing the calculated value of the H with a predetermined value, and rejecting the inspected enclosure as defective when the compared values have an impermissible deviation from one another.

2. The apparatus according to claim 1, further comprising:

image supply means for supplying electric image signals to said first storing means and to said second storing means as the respective representative electric signals.

3. The apparatus according to claim 1, wherein:

the judging means includes defect indication means for providing a signal indicating that the inspected enclosure of semiconductor devices has defects.

4. The apparatus according to claim 2, wherein said image supply means comprises:

photoelectric conversion means for producing an image signal of the inspected enclosure as an object;

A/D conversion means for converting the image signal from the photoelectric conversion means to a digital image signal;

first object image memory means for storing the digital image signal supplied from the A/D converter means;

position detection means, receiving the image signal from the first object image memory means, for detecting the position of the object;

reference image memory means for supplying to the position detection means a reference image signal for the position detection;

position correcting means, receiving signals from the first object image memory means and the position detection means, for correcting the position of the object stored in the first object image memory means; and second object image memory means for storing a position-corrected image signal from the position correcting means and supplying the stored signal to the second storing means.

5. The apparatus according to claim 4, wherein said first object image memory means, said reference image memory means, said position detecting means, said position correcting means, said second object image memory means, said first, second, third and fourth storing means, and said detection means are operated by a program loaded in a single microcomputer.

6. The apparatus according to claim 4, wherein said photoelectric conversion means converts an image of the inspected enclosure of a semiconductor device, which is illuminated by a ring-shaped illumination device, to an analog electric signal.

7. The apparatus according to claim 4, wherein said position detecting means comprises a rectangular window which can specify the number and location of pixels in the horizontal and vertical directions, two-dimensional data correlation coefficient calculation means, and position judging means, and the position detecting means, and judges the position of pixels stored in the object image memory means in relation to the position of pixels stored in the reference image memory means.

8. The apparatus according to claim 4, wherein said first storing means has addresses corresponding to the density levels of the image signal.

9. The apparatus according to claim 4, wherein said second storing means has addresses corresponding to the density levels of the image signal.

10. The apparatus according to claim 4, wherein said third storing means has addresses corresponding to the density levels of the image signal.

11. The apparatus according to claim 4, wherein said fourth storing means has addresses corresponding to the density levels of the image signal.

12. An image processing apparatus for inspecting enclosures of semiconductor devices for defects, comprising:

photoelectric conversion means for converting an image of an enclosure to be inspected to an analog object image signal;

an A/D converter for receiving the object image signal from the photoelectric conversion means and converting the object image signal to an object digital image data item;

detecting means for receiving the object digital image data item from the A/D converter, forming a first histogram R of this data item, and comparing the first histogram R with a second histogram P by performing calculation based on the following formulas:

$$H = \frac{A - \frac{1}{m \times n} B \cdot C}{\sqrt{D - \frac{1}{m \times n} B^2} \cdot \sqrt{E - \frac{1}{m \times n} C^2}}$$

$$A = \sum_{i=1}^{m} \sum_{j=1}^{n} \{P(X_p + i - 1, Y_p + j - 1) \cdot R(X_r + i - 1, Y_r + j - 1)\}$$

$$B = \sum_{i=1}^{m} \sum_{j=1}^{n} \{P(X_p + i - 1, Y_p + j - 1)\}$$

$$C = \sum_{i=1}^{m} \sum_{j=1}^{n} \{R(X_r + i - 1, Y_r + j - 1)\}$$

$$D = \sum_{i=1}^{m} \sum_{j=1}^{n} \{P(X_p + i - 1, Y_p + j - 1)\}^2$$

$$E = \sum_{i=1}^{m} \sum_{j=1}^{n} \{R(X_r + i - 1, Y_r + j - 1)\}^2$$

where $P(X_p, Y_p)$ and $R(X_r, Y_r)$ indicate pixel density data at coordinates $(X_p, Y_p)$ and $(X_r, Y_r)$, respectively, m is the number of pixels included in one horizontal pixel array of a window, and n is the number of pixels included in one vertical pixel array of the window, the window defining a range of the first and second histograms R and P at the time of calculation; and means for judging whether or not the object has defects by electronically comparing the calculated value of the H with a predetermined value, and rejecting the inspected enclosure as defective when the compared values have an impermissible deviation from one another.

13. The apparatus according to claim 12, wherein said detection means compares the reference image histogram with the object image histogram after these histograms are accumulated.

14. The apparatus according to claim 12, wherein said detecting means includes a memory having addresses corresponding to the density levels of the image data.

15. The apparatus according to claim 12, wherein said detecting means corrects the position of the image data of the object, based on the reference image data, before comparing the reference histogram with the object histogram.

16. An image processing method for inspecting enclosures of semiconductor devices for defects, comprising:

an input processing first step for processing an image of an enclosure to be inspected to provide an electric signal representative thereof;

a second step for judging whether or not a reference image has been recorded;

a third step for recording an image signal representative of the reference image in a memory, when a result in the second step is NO;

a fourth step for forming an electric reference image density histogram from said image signal;

a fifth step for forming an electric reference image density accumulated histogram R from said reference image density histogram, a routine of control being returned to the input processing first step after the fifth step;

a sixth step for detecting the position of the enclosure, the sixth step being performed when a result in the second step is YES;

a seventh step for forming an electric object image density relative histogram P from a result of detecting of the sixth step;

an eighth step for forming an electric object image density accumulated relative histogram from said object image density relative histogram P;

a ninth step for electronically detecting a maximum coincidence position between said reference image density accumulated histogram R and said object image density accumulated relative histogram P;

a tenth step for judging a coincidence degree H at the maximum coincidence position in said histograms by electronically performing calculation based on the following formulas:

$$H = \frac{A - \frac{1}{m \times n} B \cdot C}{\sqrt{D - \frac{1}{m \times n} B^2} \cdot \sqrt{E - \frac{1}{m \times n} C^2}}$$

$$A = \sum_{i=1}^{m} \sum_{j=1}^{n} \{P(X_p + i - 1 - 1, Y_p + j - 1) \cdot R(X_r + i - 1, Y_r + j - 1)\}$$

$$B = \sum_{i=1}^{m} \sum_{j=1}^{n} \{P(X_p + i - 1, Y_p + j - 1)\}$$

$$C = \sum_{i=1}^{m} \sum_{j=1}^{n} \{R(X_r + i - 1, Y_r + j - 1)\}$$

$$D = \sum_{i=1}^{m} \sum_{j=1}^{n} \{P(X_p + i - 1, Y_p + j - 1)\}^2$$

$$E = \sum_{i=1}^{m} \sum_{j=1}^{n} \{R(X_r + i - 1, Y_r + j - 1)\}^2$$

where $P(X_p, Y_p)$ and $R(X_r, Y_r)$ indicate pixel density data at coordinates $(X_p, Y_p)$ and $(X_r, Y_r)$, respectively, m is the number of pixels included in one horizontal pixel array of a window, and n is the number of pixels included in one vertical pixel array of the window, the window defining a range of the first and second histograms R and P at the time of calculation;

an eleventh step for electronically comparing the calculated value of the H with a predetermined value;

a twelfth step for judging whether or not the enclosure is good, based on the deviation of the compared values;

a thirteenth step for subjecting a good enclosure to a predetermined processing when the result in the twelfth step is OK; and a fourteenth step for subjecting a bad enclosure to a predetermined processing, when the first result in the tenth step is not OK, or when the result in the twelfth step is NO.

17. An image processing method for inspecting enclosures of semiconductor devices for defects, comprising:

a first step for receiving a reference image density histogram R;

a second step for forming a reference image density accumulated histogram R from the reference image density histogram R;

a third step for forming an object image density relative histogram P representing an inspected enclosure;

a fourth step for forming an object image density accumulated relative histogram P from the object image density relative histogram P;

a fifth step for electronically detecting coincidence degree H between the reference image density accumulated histogram R and the object image density accumulated relative histogram P by performing calculation based on the following formulas:

$$H = \frac{A - \frac{1}{m \times n} B \cdot C}{\sqrt{D - \frac{1}{m \times n} B^2} \cdot \sqrt{E - \frac{1}{m \times n} C^2}}$$

$$A = \sum_{i=1}^{m} \sum_{j=1}^{n} \{P(X_p + i - 1 - 1, Y_p + j - 1) \cdot R(X_r + i - 1, Y_r + j - 1)\}$$

$$B = \sum_{i=1}^{m} \sum_{j=1}^{n} \{P(X_p + i - 1, Y_p + j - 1)\}$$

$$C = \sum_{i=1}^{m} \sum_{j=1}^{n} \{R(X_r + i - 1, Y_r + j - 1)\}$$

$$D = \sum_{i=1}^{m} \sum_{j=1}^{n} \{P(X_p + i - 1, Y_p + j - 1)\}^2$$

$$E = \sum_{i=1}^{m} \sum_{j=1}^{n} \{R(X_r + i - 1, Y_r + j - 1)\}^2$$

where $P(X_p, Y_p)$ and $R(X_r, Y_r)$ indicate pixel density data at coordinates $(X_p, Y_p)$ and $(X_r, Y_r)$, respectively, m is the number of pixels included in one horizontal pixel array of a window, and n is the number of pixels included in one vertical pixel array of the window, the window defining a range of the first and second histograms R and P at the time of calculation; and a sixth step for judging whether or not the object has defects by electronically comparing the calculated value of the H with a predetermined value, and rejecting the inspected enclosure as defective when the compared values have an impermissible deviation from one another.

18. An image processing apparatus according to claim 1, wherein the pixel density data is 256-gradation data.

19. An image processing apparatus according to claim 1, wherein the predetermined value is about 0.7.

20. An image processing apparatus according to claim 12, wherein the pixel density data is 256-gradation data.

21. An image processing apparatus according to claim 12, wherein the predetermined value is about 0.7.

22. An image processing method according to claim 16, wherein the pixel density data is 256-gradation data.

23. An image processing method according to claim 16, wherein the predetermined value is about 0.7.

24. An image processing method according to claim 17, wherein the pixel density data is 256-gradation data.

25. An image processing method according to claim 17, wherein the predetermined value is about 0.7.

* * * * *